United States Patent [19]

Abrahamson

[11] Patent Number: 5,942,078
[45] Date of Patent: Aug. 24, 1999

[54] APPARATUS FOR CALIBRATING SURFACE MOUNTING PROCESSES IN PRINTED CIRCUIT BOARD ASSEMBLY MANUFACTURING

[75] Inventor: Steve Abrahamson, Boise, Id.

[73] Assignee: MCMS, Inc., Nampa, Id.

[21] Appl. No.: 08/895,765

[22] Filed: Jul. 17, 1997

[51] Int. Cl.⁶ .............................. G01B 21/08; B32B 31/00
[52] U.S. Cl. ........................... 156/378; 73/150; 73/432.1; 156/64; 156/358
[58] Field of Search ............................... 156/64, 358, 378; 73/54.22, 64.48, 64.52, 150 R, 150 A, 53.01, 432.1

[56] References Cited

U.S. PATENT DOCUMENTS

| | | | |
|---|---|---|---|
| 5,237,622 | 8/1993 | Howell | 382/8 |
| 5,247,844 | 9/1993 | Howell | 73/865.8 |
| 5,537,204 | 7/1996 | Woodhouse | 356/243 |
| 5,662,763 | 9/1997 | Yamanaka | 156/358 |

*Primary Examiner*—David A. Simmons
*Assistant Examiner*—Robert R. Koehler
*Attorney, Agent, or Firm*—Seed and Berry, LLP

[57] ABSTRACT

An apparatus for calibrating surface mounting processes in the manufacturing of printed circuit board assemblies. In one embodiment of the invention, a test pad of adhesive is deposited onto a substrate, and then a test module is mounted to the substrate at the test pad. The test module is representative of an electrical component that is to be mounted to a printed circuit board, and the test module is mounted to the substrate in a manner in which the electrical component is to be mounted to a printed circuit board. After the test module is mounted to the substrate, the profile of the test pad is detected through the substrate and/or the test module to determine whether the test pad contacts enough of the test module to sufficiently adhere the test module to the substrate without interfering with the terminals of the test module. Accordingly, this embodiment of the invention provides an indication or estimate of the desired volume of an adhesive pad to mount a specific component to a PCB.

12 Claims, 4 Drawing Sheets

APPARATUS FOR CALIBRATING SURFACE MOUNTING PROCESSES IN PRINTED CIRCUIT BOARD ASSEMBLY MANUFACTURING

TECHNICAL FIELD

The present invention relates to manufacturing printed circuit board assemblies, and more specifically to determining a desired volume of adhesive to deposit in each adhesive pad to surface mount components to the printed circuit board.

BACKGROUND OF THE INVENTION

Printed circuit board assemblies ("PCAs") with electrical components are used in computers, communications equipment, televisions, and many other products. A PCA typically has a wide variety of electrical components mounted to a printed circuit board ("PCB") to operatively couple the electrical components to desired circuits. The PCB is generally a laminated board with circuit traces on external surfaces of the board or at interlayer levels within the board, and the electrical components are typically light-emitting diodes ("LEDs"), processors, memory devices, clock generators, resistors, cooling units, capacitors and virtually any other type of electrical components. As PCAs become more complex, over 1,000 passive components may be mounted to one side of the PCB. Accordingly, the size of many of the passive components may be as small as approximately 0.080 in×0.050 in (a "0805" component) to approximately 0.040 in×0.020 in (a "0402" component). Since the electronics manufacturing industry is highly competitive, it is important to quickly and accurately attach a large number of passive components to the PCBs.

Such small passive components generally have very small terminals, and each passive component is typically surface mounted on a PCB to couple each terminal of a component to a contact pad on the PCB. In typical surface mounting techniques, pads of solder paste are deposited onto respective electrical contacts to form multiple solder pads, and adhesive pads are deposited at vacant areas in between the solder pads where components are to be mounted to the PCB. The solder pads and the adhesive pads may be deposited onto the PCB using a stencil printing machine or a pen dispenser known in the art. After the solder pads and adhesive pads are deposited onto the PCB, a pick-and-place machine picks up an electrical component, orients the electrical component to align an appropriate solder pads with the terminals of the component, and then presses the component against the solder pads and at least one corresponding adhesive pad.

Surface mounting components to a PCB, and particularly surface mounting large numbers of small components, raises several manufacturing concerns in PCA manufacturing. One such concern is depositing a sufficient amount of adhesive to adhere a particular component to the PCB without interfering with the electrical contacts on the PCB. In general, a sufficient amount of adhesive must be deposited to withstand 8 pounds of shear force to prevent an attached electrical component from detaching from the PCB, but the adhesive pads cannot spread and interfere with the electrical contacts as the components are pressed against the adhesive pads. Determining the desired volume of the adhesive pads is particularly important for surface mounting small components because the electrical contacts on the PCB are very close to each other. Accordingly, to surface mount small components to a PCB, it is generally necessary to maximize the volume of the adhesive pads without interfering with the electrical contacts between the PCB and the components.

A significant problem in PCA manufacturing is determining the appropriate shape and volume of the adhesive pads to attach components to a PCB without interfering with the electrical contacts of the PCA. Conventional PCA manufacturing processes determine the shape and volume of the adhesive pads on a trial-and-error basis by mounting a component to a PCB and then testing whether the component is operatively coupled to the PCB and can withstand 8 pounds of shear force. It will be appreciated that conventional trial-and-error testing is time-consuming and may tie up the PCA assembly line for a significant period of time while different shapes and volumes of adhesive pads are tested. Such down-time associated with conventional trial-and-error adhesive pad testing is particularly problematic in contract PCA manufacturing in which several different configurations of PCAs with different adhesive pad parameters may be manufactured in a single day. Thus, it would be desirable to develop an apparatus and method for determining the desired volume and/or shape of each adhesive pad to be deposited onto a printed circuit board in PCA manufacturing.

SUMMARY OF THE INVENTION

The present invention is directed toward surface mounting electrical components to printed circuit boards in the manufacturing of printed circuit board assemblies. In one embodiment of the invention, a test pad of adhesive is deposited onto a substrate, and then a test module is mounted to the substrate at the test pad. The test module is representative of an electrical component of the type that is to be mounted to a printed circuit board, and the test module is mounted to the substrate in a manner in which the electrical component is to be mounted to the printed circuit board. After the test module is mounted to the substrate, the profile of the test pad is detected to determine whether the test pad contacts enough of the test module to sufficiently adhere the test module to the substrate without interfering with the terminals of the test module. The profile of the test pad may be optically detected through the substrate and/or the test module, or the profile may be electronically detected via an electrical sensor. Accordingly, this embodiment of the invention provides an indication or estimate of the desired volume and/or shape of an adhesive pad to mount a specific component to a PCB.

The test modules are generally actual electrical components of the type to be mounted to the PCB, or the test modules may be test parts configured to correspond to the actual electrical components. When the test module is one of the actual electrical components to be mounted to the PCB, the substrate is preferably an optically transmissive plate made from glass or another suitable optically transmissive material. On the other hand, when the test module is a test part, the test module and/or the substrate may be made from an optically transmissive material.

In another embodiment of the invention, a test pad of adhesive is deposited onto a calibration plate with a specific adhesive dispenser and a test module is mounted to the test pad with a specific placement machine. One embodiment of a calibration plate in accordance with the invention has a substrate with a top surface, a plurality of reference pads configured in a reference pad pair, and a tolerance indicator positioned relative to the reference pad pair. The tolerance indicator indicates the minimum and/or maximum desired spread of a test pad with respect to the reference pads on the substrate. As described above, the test module is generally representative of the specific electrical component to be mounted to a printed circuit board, and the test module is mounted to the substrate in a manner in which the specific component would be mounted to the printed circuit board. After the test module is mounted to the substrate, the profile of the test pad is detected to determine whether the edge of the test pad is generally within the area defined by the tolerance indicator.

The calibration plate may have an optically transmissive substrate, and the reference pads may be opaque elements embedded into the substrate or outlines etched into the top surface of the substrate. Additionally, the tolerance indicator may be two opaque strands embedded into the substrate in which one strand defines a minimum spread line and the other strand defines a maximum spread line. The minimum spread line is configured with respect to the reference pad pair to indicate the minimum volume of a test pad sufficient to adhere the test module to the substrate. Conversely, the maximum spread line is configured with respect to the reference pad pair to indicate the maximum volume of a test pad that can occur without interfering with the electrical terminals of the test module.

DETAILED DESCRIPTION OF THE INVENTION

Figure 1A:
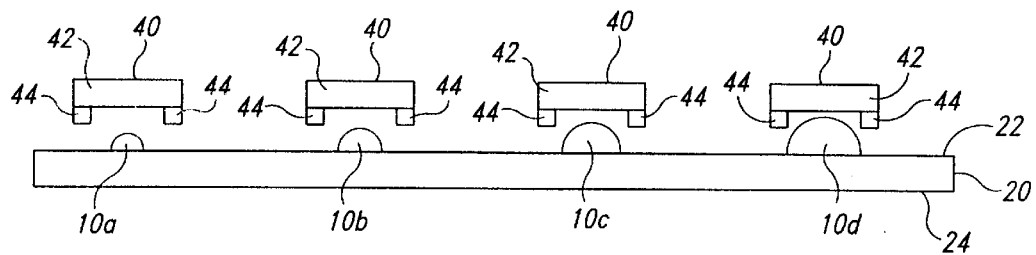
FIG. 1A is a schematic side view of an embodiment of a method in accordance with the invention at a point at which a test pad of adhesive is deposited onto a substrate.
Figure 1B:
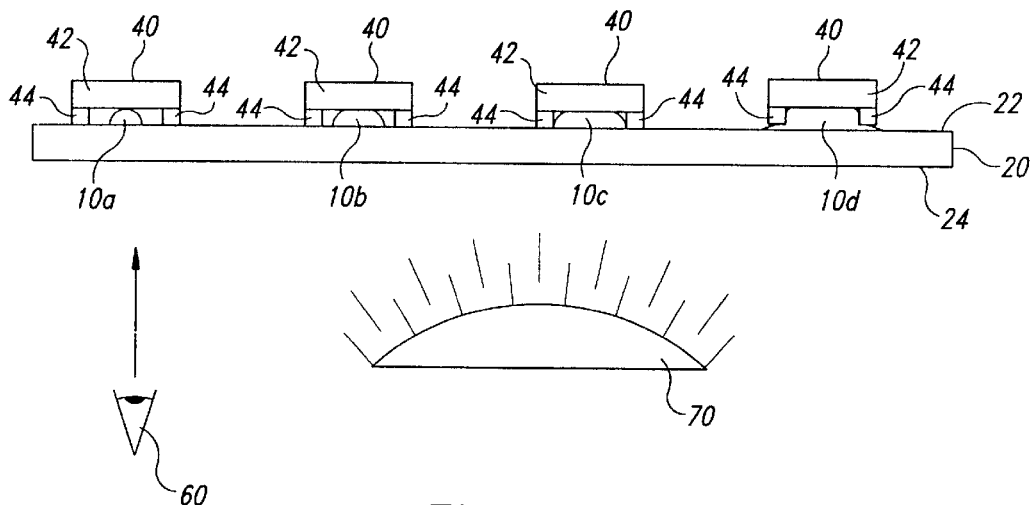
FIG. 1B is a schematic side view of the method of FIG. 1A at a subsequent point at which a test module is mounted to the substrate at the test pad and the profile of the test pad is observed through the substrate.
Figure 1C:
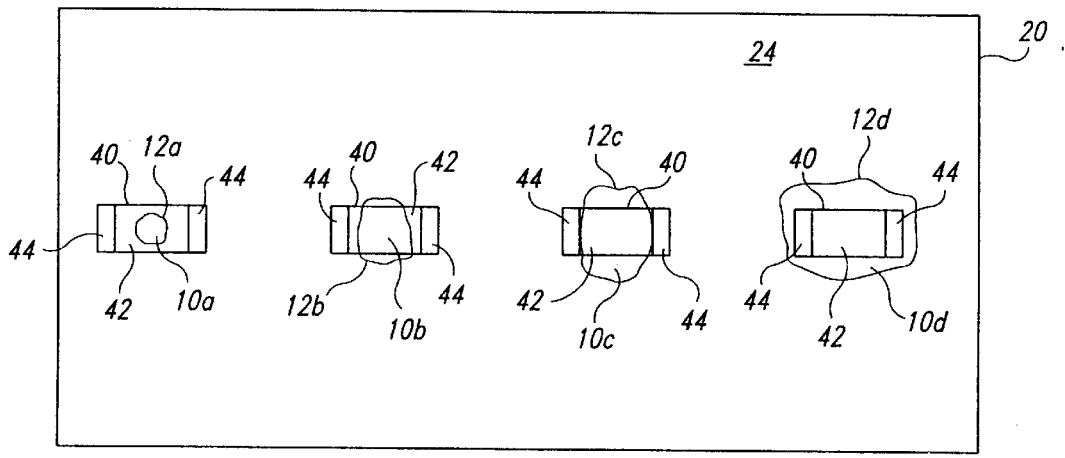
FIG. 1C is a schematic bottom plan view of the method of FIG. 1B.

FIGS. 1A and 1B are schematic side views, and FIG. 1C is a schematic plan view, of steps of an embodiment of a method in accordance with the invention using an embodiment of an apparatus in accordance with the invention to determine or estimate the spread of a pad of adhesive in surface mounting components to a PCB. FIG. 1A illustrates an embodiment of an early step in which several test pads 10 (indicated by reference numbers 10a–10d) are deposited onto a substrate 20 with a stencil machine, pen dispenser or other type of dispenser that can deposit an accurate volume of adhesive onto the substrate 20. In one embodiment, the test pads are deposited with a stenciling machine of a PCA manufacturing line between printing cycles. It will be appreciated that stencil printing the test pads 10 provides control of both the volume and the shape of the test pads 10. Additionally, since stenciling machines are idle for approximately five to fifteen minutes between printing cycles in a typical PCA manufacturing process, the test pads 10 may be deposited onto the substrate 20 between printing cycles without adversely affecting the throughput of a run of PCAs.

The test pads 10 may be made from the actual type of adhesive used to surface mount a component to a PCB, or the test pads 10 may be made from other deformable compounds. To accurately represent the spread of the actual type of adhesive, test pads 10 made from other deformable compounds generally have the same flow and deformation characteristics of the actual type of adhesive used to surface mount the component to a PCB. Each of the test pads 10a–10d may have a different size and shape for each of the test modules 40, or the test pads 10a–10d may all have substantially similar sizes and shapes. The test pads 10 may accordingly be configured to estimate the surface area on the test module covered by the spread of several different sizes and shapes of adhesive pads in a single test, or to determine the average spread of several similarly sized and shaped adhesive pads.

Additionally, in the embodiment of the method illustrated in FIG. 1A, the substrate 20 is an optically transmissive plate through which the outline of materials on a first side 22 of the substrate 20 may be observed from a second side 24 of the substrate 20. The test modules 40 in the embodiment shown in FIG. 1A are thus actual electrical components 42 of the type that are to be mounted to a PCB with component terminals 44. In general, the component terminals 44 are as conductors positioned at electrical contact points of the electrical components 42. As described in greater detail below, however, the substrate 20 and the test modules 40 may have several other embodiments.

FIGS. 1B and 1C illustrate embodiments of subsequent steps of the method after the test pads 10 are deposited onto the substrate 20. The test modules 40 are mounted onto the substrate 20 at the test pads 10, and as the test modules 40 press against the test pads 10, the test pads 10 deform and flow between the substrate 20 and the test modules 40. The deformation of the test pads 10 is, in part, a function of the size, shape and placement of both the test pads 10 and the test modules 40. The test modules 40 may be mounted to the substrate 20 with a pick-and-place machine, or the test modules 40 may be manually pressed onto the substrate 20 with a similar force as a pick-and-place machine. In either case, the deformation or spread of the test pads 10 generally replicates the spread of an adhesive pad between a PCB and a component corresponding to the test module 40 that is mounted to the PCB with a pick-and-place machine. Although the substrate 20 may be virtually any size to accommodate one or more test modules 40, the substrate 20 is preferably configured to be held in a pick-and-place machine so that the test modules 40 may be mounted to the substrate 20 as if the test modules 40 were being mounted to a PCB.

After the test modules 40 are mounted to the substrate, a perimeter or profile 12 (shown in FIG. 1C by reference numbers 12a–12d) of each test pad 10 is detected through the optically transmissive substrate 20. The profile 12 of the test pads 10 may be detected with a sensor 60 (shown in FIG. 1B) that senses the spread of the test pads 10. The sensor 60 may be a camera, gray scale camera, a human eye, or other types of sensors that can delineate the profile 12 of the test pads 10. In one embodiment, a light source 70 positioned on the second side 24 of the substrate 20 illuminates the underside of the test modules 40 and the spread of the test pads 10 to further contrast the profile 12 of the test pads 10 with respect to the terminals 44 of the test modules 40. The light source 70 may emit white light or another type of light with a selected wavelength to illuminate or otherwise enhance the contrast between the perimeter 12 of the deformed test pads 10 and the test modules 40.

In addition to detecting or observing the profile 12 of the deformed test pads 10, the spread of the test pads 10 is generally evaluated to determine or estimate a desired volume and/or shape of an adhesive pad for use with the particular type of electrical component represented by the test module 40. As shown in FIG. 1C, the test pad 10a may not be sufficient to adequately adhere the test module 40 to the substrate 20 because the test pad 10a contacts only a small portion of the test module 40. Conversely, the test pad 10d may interfere with the contact between the terminals 44 of the test module 40 and the substrate 20 (best shown in FIG. 1B) because the test pad 10d is too large and covers the portion of the substrate 20 under the terminals 44. The size and shape of test pads 10b and 10c, on the other hand, may be acceptable for adhering the test modules 40 to the substrate 20 because the perimeters 12b and 12c of test pads 10b and 10c cover a significant portion of the test modules 40 without separating the terminals 44 from the substrate 120. The test pad 10c, for example, represents an approximation of the maximum volume of an adhesive pad that can be used in connection with the test module 40 because the test pad 10c covers almost all of the surface area of the test module 40 without interfering with the terminals 44. Thus, if the test module 40 represents a very small electrical component, it may be more desirable to use an adhesive pad corresponding to the test pad 10c than the other test pads 10a, 10b and 10d.

Figure 2A:
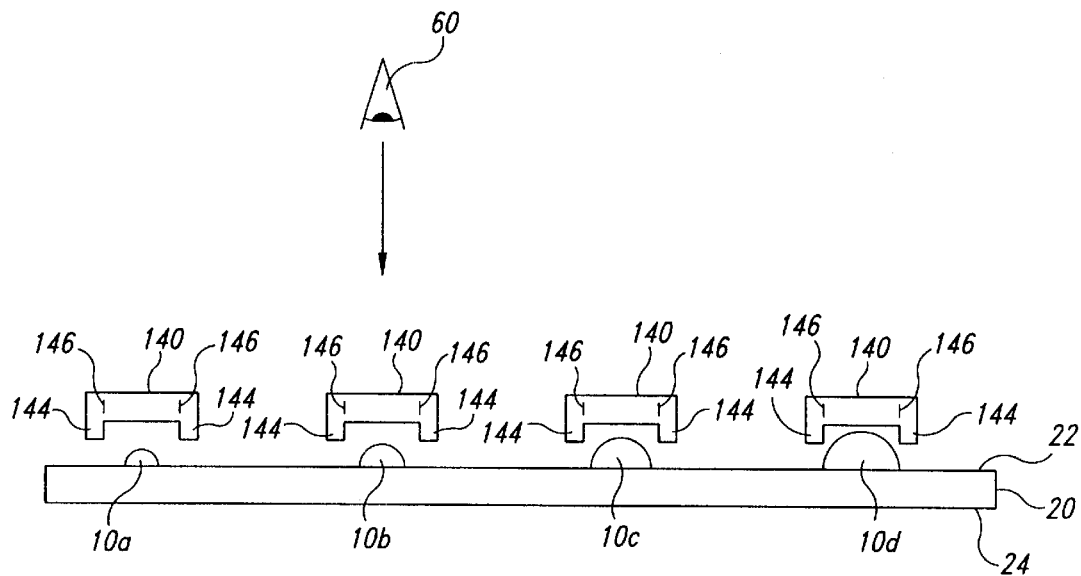
FIG. 2A is a schematic side view of another embodiment of a method in accordance with the invention at a point at which a test pad of adhesive is deposited onto a substrate.
Figure 2B:
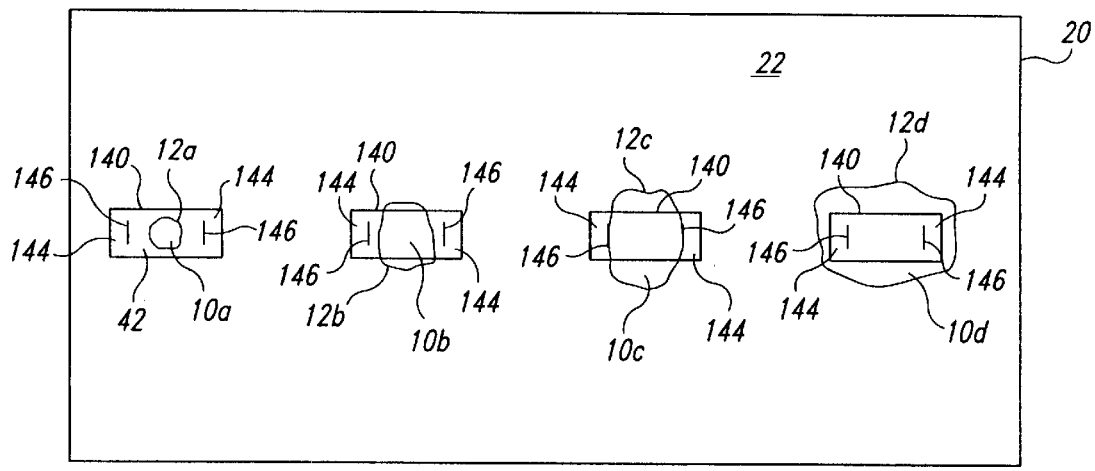
FIG. 2B is a schematic top plan view of the method of FIG. 2A at a subsequent point at which a test module is mounted to the substrate and the profile of the test pad is detected through the test module.

FIG. 2A is a schematic side view of a step in another embodiment of a method in accordance with the invention, and FIG. 2B is a schematic plan view of a subsequent step in this embodiment of the invention. As discussed above in FIG. 1A, FIG. 2A illustrates an embodiment of an early step of the method in which a plurality of test pads 10 (indicated by reference numbers 10a–10d) are deposited onto a substrate 20. Unlike the transparent substrate 20 in FIG. 1A, however, the substrate 20 in FIG. 2A may be a transparent, translucent, or opaque plate. When the substrate 20 is a translucent or opaque plate, each of the test modules 140 is an optically transmissive test part configured to represent the specific type of electrical component to be mounted to the printed circuit board. The test modules 140 are accordingly shaped and sized to spread the material of the test pads 10 in the same manner as the actual type of electrical component when the test module 140 is mounted to the substrate 20. In one embodiment, the test modules 140 have feet 144 configured to represent the terminals of an actual component and indicators 146 to identify an inner wall of the feet 144. The test modules 140, however, may have other configurations depending upon the configuration of the specific type of electrical component to be mounted to the printed circuit board.

FIG. 2B illustrates an embodiment of subsequent steps in the method of FIG. 2A after the test modules 140 have been mounted to the substrate 120. As discussed above with respect to the test modules 40 of FIG. 1C, the test pads 10 deform between the test modules 140 and the substrate 20. Unlike the embodiment of the method illustrated in FIGS. 1A–1C, however, the profile 12 of the deformed test pads 10 may be detected at least in part through the test modules 140. The profile 12 of the deformed test pads 10 is accordingly detected by a sensor 60 (shown in FIG. 2A) positioned above the first surface 22 of the substrate 20. Thus, as discussed above with respect to FIGS. 1A–1C, the spread of the test pads 10 may be evaluated to determine the desired volume of the adhesive pads for surface mounting electrical components to a PCB.

One advantage of an embodiment of either of the methods illustrated in FIGS. 1A–2B is that a desired volume of an adhesive pad may be estimated prior to setting up an assembly line for a run of PCAs. For example, while an assembly line is used to surface mount one configuration of electrical components to a PCA, the desired volume of adhesive pads to surface mount another configuration of electrical components to another PCA may be estimated without interrupting the assembly line. Accordingly, several embodiments of the invention may reduce the downtime to set up an assembly line for a run of PCAs.

Another advantage of an embodiment of either of the methods illustrated in FIGS. 1A–2B is that it provides an accurate estimate of a maximum acceptable volume of an adhesive pad to surface mount an electrical component to a PCB without interfering with the electrical connections on the PCB. Conventional trial-and-error processes may eventually determine a sufficient volume for an adhesive pad to surface mount an electrical component to a PCB, but without observing the profile of the adhesive with respect to the component terminals, conventional trial-and-error processes may not determine the maximum volume of an adhesive pad. However, by deforming test pads of adhesive between an optically transmissive substrate and/or an optically transmissive test module, the actual spread of the test pads may be determined with respect to the test module. It will be appreciated that it is particularly useful to determine the maximum acceptable volume of an adhesive pad to surface mount very small components (e.g., 0402 and 0805 components) because such small components have only a small surface area for contacting the adhesive. Therefore, an embodiment of either of the methods illustrated in FIGS. 1A–2B enhances the ability to determine the maximum amount of an adhesive pad to surface mount small components to a PCB without interfering with the electrical contacts on the PCB.

In addition to the embodiments discussed above with respect to FIGS. 1A–2B, the adhesive or other compound of the test pads 10 may have an additive (not shown) that increases the reflectivity or provides fluorescent characteristics to the test pads 10. For example, a fluorescent compound may be added to the adhesive that emits a highly contrasting wavelength of light to sharply delineate the profile of the test pads 10. As a result, the test pads 10 may be made from a combination of several different materials that are not normally associated with surface mounting adhesives.

Figure 3A:
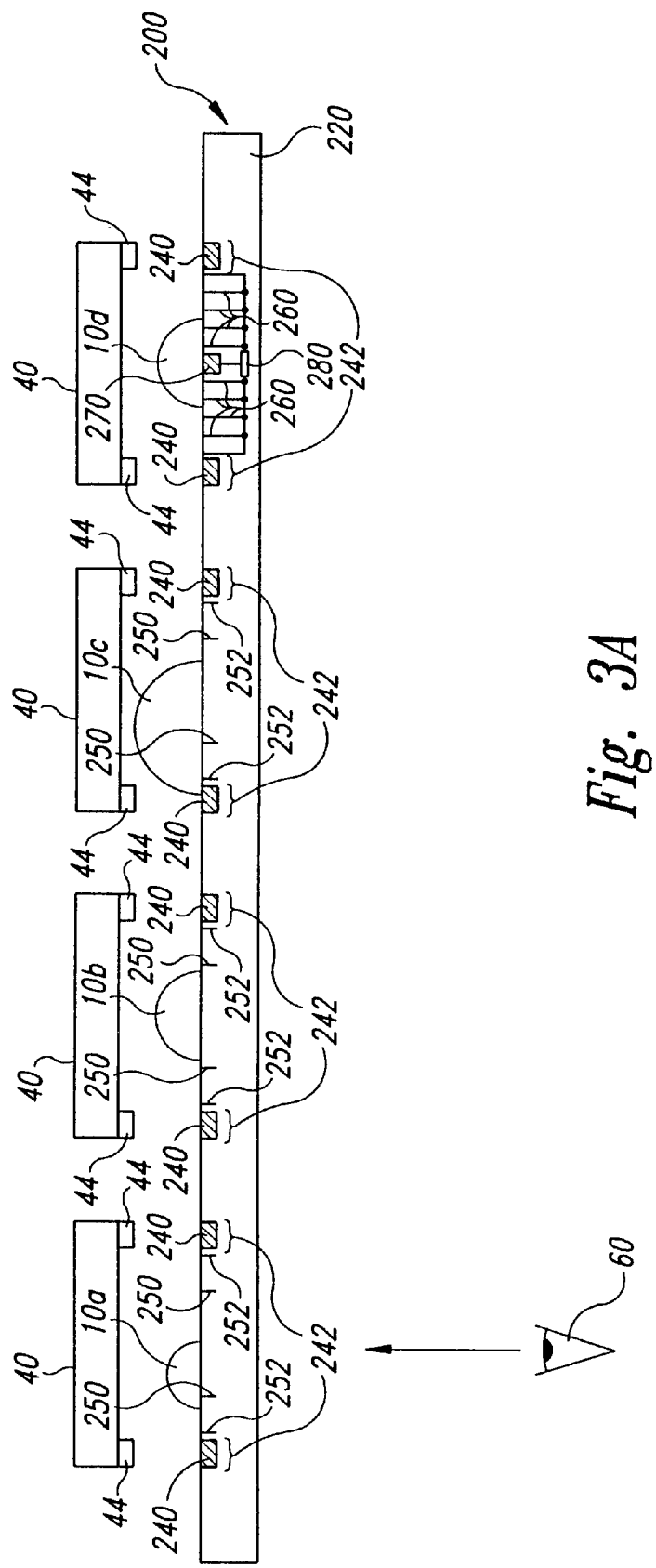
FIG. 3A is a schematic side view of an embodiment of a calibrating apparatus in accordance with the invention.
Figure 3B:
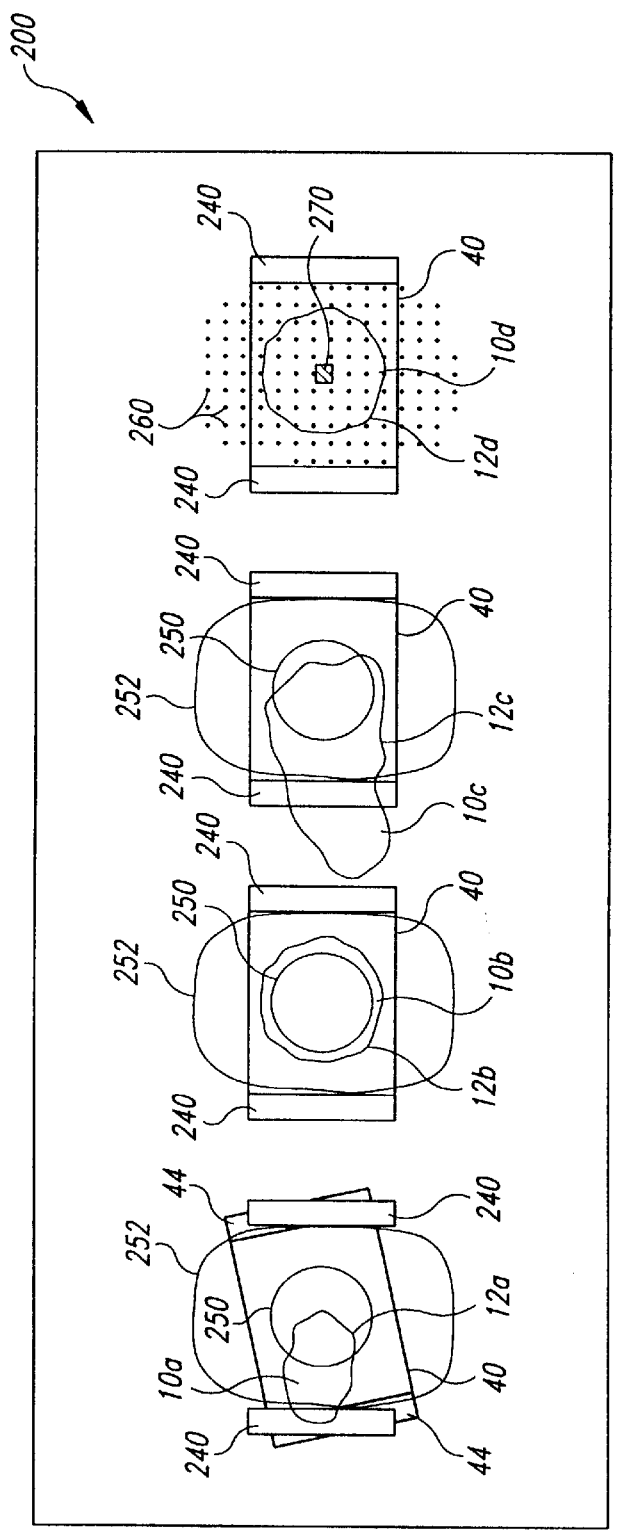
FIG. 3B is a schematic bottom plan view of the apparatus of FIG. 3A.

In addition to estimating a desired volume of an adhesive pad to surface mount a specific component to a PCB (as described above in FIGS. 2A–2B), it is often necessary to refine such estimates in light of the specific PCA configuration and the accuracy of the specific stencil printing and pick-and-place machines of an assembly line. FIGS. 3A and 3B are a schematic side view and a schematic plan view, respectively, of a calibration device 200 for determining the desired volumes of adhesive pads to surface mount components to a PCB with a specific adhesive dispenser and a specific pick-and-place machine. The embodiment of the calibration device 200 illustrated in FIGS. 3A and 3B has an optically transmissive substrate 220, a number of opaque reference pads 240 in the substrate 220 grouped into reference pad pairs 242, and tolerance lines 250 and 252 embedded in the substrate 220 between the reference pads 240 of each reference pad pair 242. The reference pads 240 may be printed or embedded into the substrate 220 in a pattern corresponding to a pattern of contact pads of a specific PCA. Accordingly, the terminals 44 of each test module 40 align with the reference pads 240 of a corresponding reference pad pair 242 when the test modules 40 are accurately positioned over the substrate 200.

The tolerance lines 250 and 252 are grouped into pairs such that each reference pad pair 242 has a corresponding pair of tolerance lines 250 and 252. Each pair of tolerance lines 250 and 252 defines a tolerance indicator to indicate the minimum and maximum spread of a test pad 10 with respect to the reference pads 240 of a corresponding reference pad pair 242. More specifically, the minimum tolerance lines 250 indicate the minimum acceptable spread of the test pads 10 across the surface of the test modules 40 to adequately adhere the test modules 40 to the substrate 220. Conversely, the maximum tolerance lines 252 indicate the maximum spread of the test pads 10 that can occur without interfering with the terminals 44 and the reference pads 240. The tolerance indicator in the substrate 200 can be configured relative to the reference pads 240 to indicate at least one of a minimum and a maximum spread of an adhesive test pad 10 when a test module 40 is mounted to the substrate 200.

In another embodiment, the substrate 220 may be an opaque or a translucent plate, and the test modules may be similar to the optically transmissive test modules 140 discussed above with respect to FIGS. 2A and 2B. Accordingly, the spread of the test pads 10 may be observed through an optically transmissive substrate 220 and/or an optically transmissive test module 140.

FIGS. 3A and 3B also illustrate the operation of an embodiment of the calibration device 200. Referring to FIG. 3A, the test pads 10 of an adhesive or an adhesive-like compound are deposited onto the surface of the substrate 220 with the specific adhesive dispenser (not shown) that will be used during the actual PCA manufacturing process. Although the adhesive dispenser ideally deposits identical adhesive pads at the center point between the reference pads 240 of each reference pad pair 242, typical adhesive dispensers deposit irregular adhesive pads 10 within a range between the reference pads 240 of each reference pad pair 242. As shown in FIG. 3A, for example, test pads 10a and 10c are slightly off center in their respective reference pad pairs 242, and test pad 10c is slightly larger than test pads 10a and 10b. Therefore, the calibration device 200 indicates inaccuracies in the placement of the test pads 10 with respect to the reference pads 240.

After the test pads 10 are deposited onto the calibration substrate 20, a test module 40 is pressed against each test pad 10. In addition to the inaccuracies of the adhesive dispenser, typical pick-and-place machines may position a particular component slightly out of alignment with the desired contact points on a PCB. Referring to FIG. 3B, for example, the test module 40 mounted to the test pad 10a is slightly out of alignment with respect to the corresponding reference pads 240 adjacent to the test pad 10a. Thus, the calibration device 200 also indicates inaccuracies in the placement of the test modules 40 with respect to the reference pads 240 of corresponding reference pad pairs 242.

After the test modules 40 are mounted to the substrate 220, the perimeter 12 (indicated by reference numbers 12a–12c) of each test pad 10 is observed by looking through the bottom of the substrate 220 to evaluate whether the spread of the test pads 10 is within the range of the tolerance lines 250 and 252. For example, the perimeters 12a and 12c of test pads 10a and 10c are outside of portions of their corresponding maximum tolerance lines 252, while the perimeter 12b of test pad 10b is within the area between its corresponding minimum and maximum tolerance lines 250 and 252. Moreover, the off-center position of the test pads 10a and 10c with respect to their respective reference pad pairs 242 indicates that adhesive dispenser is slightly out of calibration and needs to shift the adhesive pads to the right. Thus, the calibration device 200 can be used to calibrate both the volume of the adhesive pads to surface mount components to PCBs and the positioning aspects of adhesive dispensers and pick-and-place machines.

An advantage of an embodiment of the calibration device 200 and method illustrated in FIGS. 3A and 3B is that the volume of adhesive pads deposited onto the substrate 220 may be calibrated in light of the characteristics of the adhesive, the adhesive dispenser, and the pick-and-place machine. By observing the spread of the test pads 10 between the test modules 40 and the substrate 220, the calibration device 200 provides a significant amount of information to better identify the specific aspects of the PCA assembly line that need to be adjusted to surface mount compounds to the PCBs. Accordingly, an embodiment of the calibration device 200 may be used to determine the actual maximum volume of the adhesive pads that may be deposited onto a PCB based upon the specific configuration of a PCA, the actual accuracy of a specific adhesive dispenser, and the actual accuracy of a specific pick-and-place machine.

FIGS. 3A and 3B also illustrate still another embodiment of the calibration device 200 in which the profile of a test pad may be detected with an electrical sensor system instead of an optical sensor. Referring to the portion of the substrate 220 and the test module 40 corresponding to another test pad 10d, a plurality of point terminals 260 are positioned in the substrate 220 between the test pads 240 and a central terminal 270 is positioned in the substrate 220 at a target location where the test pad 10d is to be deposited on the substrate 220. The point terminals 260 and the central terminal 270 are operatively coupled to a power supply (not shown) so that the test pad 10d carries a current between the central terminal 270 and any point terminal 260 contacted by the test pad 10d. The point terminals 260 and the central terminal 270 are also coupled to an indicator 280 that indicates which point terminals 260 are electrically coupled to the central terminal 270 via the test pad 10d. The point terminals 260 may be configured into a grid to indicate the general profile of the test pad 10d, or the point terminals 260 may be configured into tolerance lines (not shown) to indicate the portion of the test pad 10d that crosses the tolerance lines.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An apparatus for calibrating a desired volume of an adhesive pad to surface mount an electrical component with terminals to a printed circuit board, comprising:

a substrate having a top surface and a bottom surface;

a plurality of reference pads configured in the substrate to define a reference pad pair corresponding to a configuration of the terminals of the electrical component; and a tolerance indicator in the substrate configured relative to the reference pads to indicate a minimum and a maximum spread of an adhesive test pad when a test module is mounted to the substrate.

2. The calibrating apparatus of claim 1 wherein the substrate comprises an optically transmissive plate and the reference pads comprise opaque inserts positioned in the plate.

3. The calibrating apparatus of claim 1 wherein the substrate comprises an optically transmissive plate and each reference pad comprises an outline of contact pad formed on the top surface of the plate.

4. The calibrating apparatus of claim 1 wherein the tolerance indicator comprises a minimum tolerance line to indicate a minimum spread of the test pad between the reference pads and a maximum tolerance line to indicate the maximum spread of the test pad.

5. The calibrating apparatus of claim 4 wherein the substrate comprises an optically transmissive plate and the minimum and maximum tolerance lines each comprise an opaque strand embedded in the substrate between the reference pads.

6. The calibrating apparatus of claim 4 wherein the substrate comprises an optically transmissive plate and the minimum and maximum tolerance lines each comprise a line cut in the top surface of the substrate.

7. An apparatus for calibrating a desired volume of an adhesive pad to surface mount an electrical component with terminals to a printed circuit board, comprising:

a substrate having a top surface and a bottom surface;

a plurality of reference pads configured in the substrate to define a reference pad pair corresponding to a configuration of the terminals of the electrical component; and a first tolerance line in the substrate configured relative to the reference pads to indicate either a minimum or a maximum spread of an adhesive test pad when a module is mounted to the substrate.

8. The apparatus of claim 7, further comprising a second tolerance line in the substrate configured relative to the reference pads and the first tolerance line to indicate the other of the minimum or the maximum spread of an adhesive test pad when a module is mounted to the substrate.

9. The calibrating apparatus of claim 8 wherein the substrate comprises an optically transmissive plate and the reference pads comprise opaque inserts positioned in the plate.

10. The calibrating apparatus of claim 8 wherein the substrate comprises an optically transmissive plate and each reference pad comprises an outline of contact pad formed on the top surface of the plate.

11. The calibrating apparatus of claim 8 wherein the substrate comprises an optically transmissive plate and the first and second tolerance lines each comprise an opaque strand embedded in the substrate between the reference pads.

12. The calibrating apparatus of claim 8 wherein the substrate comprises an optically transmissive plate and the first and second tolerance lines each comprise a line cut in the top surface of the substrate.

* * * * *